United States Patent
Hasegawa et al.

(10) Patent No.: US 9,985,413 B2
(45) Date of Patent: May 29, 2018

(54) OPTICAL SEMICONDUCTOR DEVICE AND METHOD OF FABRICATING THE SAME

(71) Applicant: Sumitomo Electric Device Innovations, Inc., Yokohama-shi (JP)

(72) Inventors: Taro Hasegawa, Yokohama (JP); Toshiyuki Taguchi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days. days.

(21) Appl. No.: 14/500,292

(22) Filed: Sep. 29, 2014

(65) Prior Publication Data

US 2015/0092799 A1    Apr. 2, 2015

(30) Foreign Application Priority Data

Sep. 30, 2013 (JP) .................. 2013-205233

(51) Int. Cl.
| | |
|---|---|
| *H01L 27/15* | (2006.01) |
| *H01L 33/00* | (2010.01) |
| *H01L 31/02* | (2006.01) |
| *H01L 23/14* | (2006.01) |
| *H01L 21/00* | (2006.01) |
| *H01S 5/026* | (2006.01) |
| *H01S 5/06* | (2006.01) |

(Continued)

(52) U.S. Cl.
CPC ............ *H01S 5/0261* (2013.01); *H01L 21/00* (2013.01); *H01S 5/0612* (2013.01); *H01S 5/06256* (2013.01); *H01S 5/06258* (2013.01); *H01S 5/0265* (2013.01); *H01S 5/1212* (2013.01); *H01S 5/3434* (2013.01)

(58) Field of Classification Search
CPC ......... H01S 5/125; H01L 21/02; H01L 27/15; H01L 33/00; H01L 23/14; H01L 31/02
USPC ......... 257/78–81, 702, E33.001; 438/31, 22; 372/20, 34
See application file for complete search history.

(56) References Cited

U.S. PATENT DOCUMENTS 4,720,693 A * 1/1988 Tikes ..................... H01P 1/08
 333/252
5,379,318 A * 1/1995 Weber ................ H01S 5/06256
 372/20

(Continued)

FOREIGN PATENT DOCUMENTS

| JP | H10-233548 A | 9/1998 |
|---|---|---|
| JP | 2002-026255 A | 1/2002 |

(Continued)

OTHER PUBLICATIONS

English Translation of JP2014110272 Hiroshi Jun. 12, 2014.*

*Primary Examiner* — Tod T Van Roy
*Assistant Examiner* — Sheikh Maruf
(74) *Attorney, Agent, or Firm* — Venable LLP; Michael A. Sartori; Miguel A. Lopez (57) ABSTRACT

An optical semiconductor device comprises: a first insulating film provided on a semiconductor layer; a heater provided on the first insulating film; a second insulating film provided on the heater; and an electrode provided on the heater. The electrode extends on the second insulating film; the electrode is in contact with the heater; the second insulating film includes a first region on which the electrode is located; and a thickness of the first region of the second insulating film is greater than that of the first insulating film.

4 Claims, 8 Drawing Sheets

(51) Int. Cl.
*H01S 5/0625* (2006.01)
*H01S 5/343* (2006.01)
*H01S 5/12* (2006.01)

(56) References Cited

U.S. PATENT DOCUMENTS

| | | | | |
|---|---|---|---|---|
| 6,590,924 | B2* | 7/2003 | Fish | B82Y 20/00 356/301 |
| 7,366,220 | B2* | 4/2008 | Takabayashi | H01S 5/06256 372/102 |
| 7,394,838 | B2* | 7/2008 | Borley | H01S 5/06256 372/20 |
| 2002/0061047 | A1* | 5/2002 | Fish | B82Y 20/00 372/102 |
| 2002/0076149 | A1* | 6/2002 | Deacon | G02B 6/1228 385/27 |
| 2002/0105991 | A1* | 8/2002 | Coldren | B82Y 20/00 372/50.1 |
| 2003/0086655 | A1* | 5/2003 | Deacon | H01S 5/026 385/50 |
| 2003/0128724 | A1* | 7/2003 | Morthier | H01S 5/06206 372/20 |
| 2003/0147588 | A1* | 8/2003 | Pan | G02B 6/02138 385/37 |
| 2004/0218639 | A1* | 11/2004 | Oh | H01S 5/06256 372/20 |
| 2007/0036188 | A1* | 2/2007 | Fujii | H01S 5/12 372/50.11 |
| 2008/0050082 | A1* | 2/2008 | Mitomi | G02F 1/0356 385/131 |
| 2008/0247707 | A1* | 10/2008 | Fujii | H01S 5/0612 385/14 |
| 2010/0040101 | A1* | 2/2010 | Ishikawa | H01S 5/024 372/45.01 |
| 2010/0053019 | A1* | 3/2010 | Ikawa | H01P 3/088 343/866 |
| 2010/0142571 | A1* | 6/2010 | Park | B82Y 20/00 372/26 |
| 2010/0158056 | A1* | 6/2010 | Shin | H01S 5/06256 372/29.016 |
| 2011/0261850 | A1* | 10/2011 | Shouji | B41J 2/471 372/45.01 |
| 2011/0292955 | A1* | 12/2011 | Kaneko | B82Y 20/00 372/20 |
| 2011/0292960 | A1* | 12/2011 | Shoji | H01S 5/0265 372/50.11 |
| 2012/0051386 | A1* | 3/2012 | Kim | H01S 5/1096 372/96 |
| 2012/0097984 | A1* | 4/2012 | Ishikawa | H01S 5/0265 257/85 |
| 2013/0003762 | A1* | 1/2013 | Kaneko | H01S 5/06256 372/20 |
| 2014/0152393 | A1* | 6/2014 | Motomura | H01S 5/18377 331/94.1 |
| 2014/0301416 | A1* | 10/2014 | Davies | H01S 5/06256 372/20 |
| 2015/0010033 | A1* | 1/2015 | Davies | H01S 5/06256 372/50.11 |
| 2015/0078703 | A1* | 3/2015 | Park | H01S 5/026 385/14 |
| 2015/0092798 | A1* | 4/2015 | Ishikawa | H01S 5/0612 372/20 |

FOREIGN PATENT DOCUMENTS

| | | | | |
|---|---|---|---|---|
| JP | 2007-048988 A | | 2/2007 | |
| JP | 2007-273650 A | | 10/2007 | |
| JP | 2013-033892 A | | 2/2013 | |
| JP | 2014110272 | * | 6/2014 | ............ H01S 5/183 |

* cited by examiner

OPTICAL SEMICONDUCTOR DEVICE AND METHOD OF FABRICATING THE SAME

BACKGROUND OF INVENTION

Field of the Invention

The present invention relates to an optical semiconductor device and a method of fabricating an optical semiconductor device.

Related Background Art

Optical semiconductor devices are represented by wavelength-tunable semiconductor lasers, and in order to control the refractive index of a target portion in a wavelength-tunable semiconductor laser, the temperature of the target portion may be controlled to perform the tuning. Typically, a heater is used for the control of temperature, as described in Japanese Patent Application Publication No. 2007-48988.

SUMMARY OF THE INVENTION

In an optical semiconductor device in which a refractive index of a semiconductor region thereof is adjusted by performing the control of temperature, optical performances of the optical semiconductor device depend upon accuracy in the temperature control. Therefore, when the temperature control is carried out using a heater, the reliability of the heater is an important requirement.

An object for one aspect of the present invention is to provide an optical semiconductor device capable of suppressing degradation of a heater, and another object for another aspect of the present invention is to provide a method of fabricating the optical semiconductor device.

The optical semiconductor device according to one aspect of the present invention comprises: an optical waveguide; a first insulating film provided on the optical waveguide; a heater provided on the optical waveguide, the first insulating film disposed therebetween; a second insulating film provided on the heater, window provided at the second insulating film, the heater being exposed in the window; and an electrode formed in the window and on the second insulating film of periphery of the window, wherein a thickness of the second insulating film covered by the electrode is greater than thickness of the first insulating film.

A heater element according to another aspect of the present invention comprises: a first insulating film provided on a semiconductor layer; a heater provided on the first insulating film disposed therebetween; a second insulating film provided on the heater; a window provided at the second insulating film, the heater being exposed in the window; and an electrode formed in the window and on the second insulating film of periphery of the window, wherein a thickness of the second insulating film covered by the electrode is greater than thickness of the first insulating film.

The method of fabricating an optical semiconductor device according to the still another aspect of the present invention includes the steps of: forming a first insulating film on an optical waveguide; forming a heater on the first insulating film; forming a second insulating film on the heater, the second insulating film having a thickness greater than that of the first insulating film; forming a window in the second insulating film, the heater being exposed through the window; and forming an electrode on the second insulating film, the electrode being in contact with the heater through the window, and the electrode extending on the second insulating film.

BRIEF DESCRIPTION OF DRAWINGS

The above object and other objects, features, and advantages of the present invention will more readily become apparent in view of the following detailed description of the preferred embodiments of the present invention proceeding with reference to the accompanying drawings.

DESCRIPTION OF EMBODIMENTS

Examples will be described below with reference to the drawings.

An optical semiconductor device associated with one example comprises: an optical waveguide; a first insulating film provided on the optical waveguide; a heater provided on the optical waveguide, the first insulating film disposed therebetween; a second insulating film provided on the heater; a window provided at the second insulating film, the heater being exposed in the window; and an electrode formed in the window and on the second insulating film of periphery of the window. A thickness of the second insulating film covered by the electrode is greater than thickness of the first insulating film.

A heater element associated with one example comprises: a first insulating film provided on a semiconductor layer; a heater provided on the first insulating film disposed therebetween; a second insulating film provided on the heater; a window provided at the second insulating film, the heater being exposed in the window; and an electrode formed in the window and on the second insulating film of periphery of the window. A thickness of the second insulating film covered by the electrode is greater than thickness of the first insulating film.

A method of fabricating an optical semiconductor device associated with one example comprises the steps of: forming a first insulating film on an optical waveguide; forming a heater on the first insulating film; forming a second insulating film on the heater, the second insulating film having a thickness greater than that of the first insulating film; forming a window in the second insulating film, the heater being exposed through the window; and forming an electrode on the second insulating film, the electrode being in contact with the heater through the window, and the electrode extending on the second insulating film.

Example 1

Figure 1:
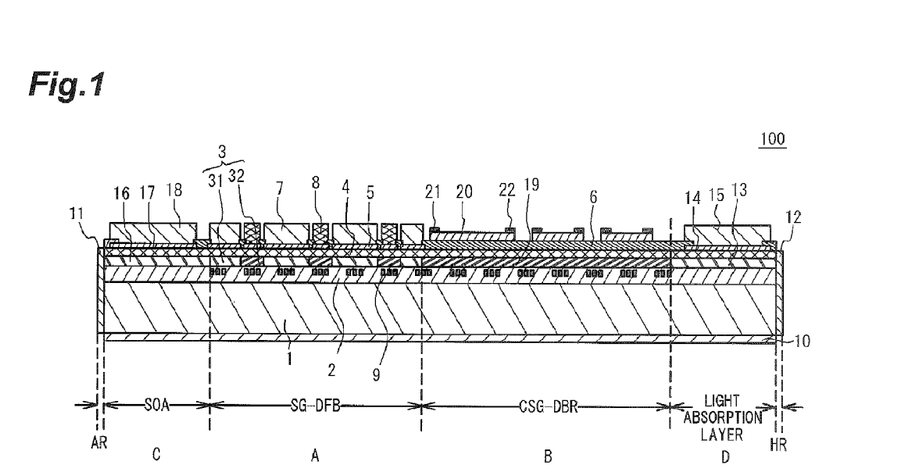
FIG. 1 is a schematic view illustrating a cross section of the structure of a semiconductor laser according to Example 1.

In Example 1, a semiconductor laser is described as one example of a semiconductor chip. FIG. 1 is a schematic cross sectional view illustrating the whole of a semiconductor laser 100 according to Example 1, and the cross section is taken along a line associated with a waveguide axis of the semiconductor laser 100. As illustrated in FIG. 1, the semiconductor laser 100 includes: a sampled grating distributed feedback (referred to as "SG-DFB") region A; a chirped sampled grating distributed bragg reflector (referred to as "CSG-DBR") region B; a semiconductor optical amplifier (referred to as "SOA") region C; a light absorbing region D; an antireflection film AR; and a reflection film HR.

In the semiconductor laser 100 shown as one example, the antireflection film AR, the SOA region C, the SG-DFB region A, the CSG-DBR region B, the light absorbing region D, the reflection film HR are arranged in this order in the direction from the front of the semiconductor laser 100 to the rear. The SG-DFB region A has an optical gain and includes a sampled grating. The CSG-DBR region B does not have any optical gain and includes a sampled grating. The SOA region C functions as an optical amplifier.

The SG-DFB region A has a stacking structure. The stacking structure includes: a lower cladding layer 2; a waveguide 3; an upper cladding layer 4; and a contact layer 5; which are stacked on a substrate 1. The waveguide 3 has an array structure of gain regions 31 and refractive index variable regions 32, and the gain regions 31 and the refractive index variable regions 32 are alternately arrayed in the light propagation direction thereof. The gain regions 31 and the refractive index variable regions 32 are in contact with each other. The contact layer 5 contains a plurality of separated contact portions, which are provided above the gain regions 31 and the refractive index variable regions 32, and positioned thereto. Since the contact layer 5 does not extend beyond boundaries between of the gain regions 31 and the refractive index variable regions 32, the contact portions are so arranged separately as not to be located on the above boundaries between the gain regions 31 and the refractive index variable regions 32. Between adjacent contact portions of the contact layer 5, insulating films are formed to isolate them. Gain control electrodes 7, which are formed on the contact layer 5, are positioned to the respective gain regions 31. Refractive index adjusting electrodes 8, which are formed on the contact layer 5, are positioned above the refractive index variable regions 32.

The CSG-DBR region B has a stacking structure, which includes: the lower cladding layer 2 provided on the substrate 1; an optical waveguide layer 19; the upper cladding layer 4; an insulating film 6; and a plurality of heaters 20. Each heater 20 includes a power electrode 21 and a ground electrode 22. The details of the plurality of heaters 20 will be described later. The SOA region C has a stacking structure, which includes: the lower cladding layer 2 provided on the substrate 1; an optical amplification layer 16; the upper cladding layer 4; a contact layer 17; and an electrode 18. The light absorbing region D has a stacking structure, which includes: the lower cladding layer 2 provided on the substrate 1; a light absorption layer 13; the upper cladding layer 4; a contact layer 14; and an electrode 15. An end face film 11 is composed of an antireflection (AR) film. A reflection film 12 is composed of a high reflection (HR) film.

Each of the SG-DFB region A, the CSG-DBR region B, the SOA region C, and the light absorbing region D includes the substrate 1, the lower cladding layer 2, and the upper cladding layer 4. Each of the substrate 1, the lower cladding layer 2, and the upper cladding layer 4 is integrally formed across the SG-DFB region A, the CSG-DBR region B, the SOA region C, and the light absorbing region D. The waveguide 3, the optical waveguide layer 19, the light absorption layer 13, and the optical amplification layer 16 are so formed as to be arranged along a single plane. A boundary between the SG-DFB region A and the CSG-DBR region B corresponds to a boundary between the waveguide 3 and optical waveguide layer 19.

The end face film 11 is formed on one end face of the semiconductor laser 100. This end face is included in the SOA region C in the present example, and the end face of the semiconductor laser 100 includes: the end face of the substrate 1; the end face of the lower cladding layer 2; the end face of the optical amplification layer 16; and the end face of the upper cladding layer 4. In the present example, the end face film 11 includes an antireflection (AR) film. The end face film 11 functions as a front facet of the semiconductor laser 100. The reflection film 12 is formed on the other end face of the semiconductor laser 100. In the present example, the other end face is included in the light absorbing region D, and the other end face of the semiconductor laser 100 includes: the end face of the substrate 1; the end face of the lower cladding layer 2; the end face of the light absorption layer 13; and the end face of the upper cladding layer 4. The reflection film 12 functions as the rear facet of the semiconductor laser 100.

The substrate 1 can be, for instance, a single crystal substrate, such as n-type InP substrate. The lower cladding layer 2 has n-type conductivity, and the upper cladding layer 4 has p-type conductivity. The lower cladding layer 2 and the upper cladding layer 4, for instance, are composed of InP. The lower cladding layer 2 and the upper cladding layer 4 optically confine light into the waveguide 3, the optical waveguide layer 19, the light absorption layer 13, and the optical amplification layer 16, which are sandwiched between the top of the lower cladding layer 2 and the bottom of the upper cladding layer 4.

Each of the gain regions 31 of the waveguide 3, for instance, has a quantum well structure, which has, for instance, a structure in which well layers and barrier layers are alternately stacked. Each well layer, for instance, is composed of $Ga_{0.32}In_{0.68}As_{0.92}P_{0.08}$ and has a thickness of 5 nm, and each barrier layer is composed of $Ga_{0.22}In_{0.68}As_{0.47}P_{0.53}$ and has a thickness of 10 nm. Each of the refractive index variable regions 32 of the waveguide 3, for instance, includes a waveguide layer composed of a $Ga_{0.28}In_{0.72}As_{0.61}P_{0.39}$ crystal. The optical waveguide layer 19, for instance, may be constituted of a bulk semiconductor, and may be composed of, for instance, $Ga_{0.22}In_{0.72}As_{0.47}P_{0.53}$. In the present example, the optical waveguide layer 19 is composed of a semiconductor having a band gap energy larger than that of the gain regions 31.

The light absorption layer 13 is composed of a material selected from materials having optical absorption in light of a lasing wavelength of the semiconductor laser 100. The light absorption layer 13 may be composed of a material having an absorption edge wavelength which is, for instance, longer than the lasing wavelength of the semiconductor laser 100. The absorption edge wavelength is preferably longer than the longest one among the lasing wavelengths of the semiconductor laser 100.

The light absorption layer 13, for instance, may have a quantum well structure, and the quantum well structure has a structure in which well layers and barrier layers are alternately stacked. The well layers, for instance, include $Ga_{0.47}In_{0.53}As$ and have a thickness of 5 nm, the barrier layers, for instance, include $Ga_{0.28}In_{0.72}As_{0.61}P_{0.39}$ and have a thickness of 10 nm. The light absorption layer 13 may be a bulk semiconductor, and may be, for instance, composed of $Ga_{0.46}In_{0.54}As_{0.98}P_{0.02}$. The light absorption layer 13 may be composed of a material identical to that of the gain region 31, and in this structure, the gain region 31 and the light absorption layer 13 may be grown in the same step, thereby simplifying the fabrication of the semiconductor laser 100.

The optical amplification layer 16 has an optical gain in response to the injection of current from the electrode 18, and is a region which can provide optical amplification by the optical gain. The optical amplification layer 16, for instance, has a quantum well structure, which may include well layers and barrier layers alternately stacked. The well layers are composed of, for instance, $Ga_{0.35}In_{0.65}As_{0.99}P_{0.01}$ and have a thickness of 5 nm, and the barrier layers are composed of $Ga_{0.15}In_{0.85}As_{0.32}P_{0.68}$ and have a thickness of 10 nm. Another structure for the optical amplification layer 16 may include, for instance, a bulk semiconductor, which is composed of $Ga_{0.44}In_{0.56}As_{0.95}P_{0.05}$ layer. The optical amplification layer 16 and the gain regions 31 may also be composed of the same material. In this structure, since the optical amplification layer 16 and the gain region 31 may be fabricated in the same step, thereby simplifying the fabrication step of the semiconductor laser 100.

Contact layers 5, 14, 17 may be composed of, for instance, a p-type $Ga_{0.47}In_{0.53}As$ crystal. An insulating film 6 is composed of a silicon based inorganic insulator, such as silicon nitride (SiN) and silicon oxide ($SiO_2$), and is provided as a protective film. The heaters 20 include thin film resistors composed of titanium tungsten (TiW), nickel chromium (NiCr), and such. Each of the heaters 20 is formed across plural segments of the CSG-DBR region B. The details of the segments will be described later.

The gain control electrodes 7, the refractive index adjusting electrodes 8, the electrodes 15, 18, the power electrodes 21, and the ground electrodes 22 are composed of a conductive material such as gold. A backside electrode 10 is formed on the rear side of the substrate 1. The backside electrode 10 is formed across the SG-DFB region A, the CSG-DBR region B, the SOA region C, and the light absorbing region D.

The end face film 11 is an AR film having reflectance of 1.0% or lower, and the end face has a substantially non-reflective property. The AR film may be constituted of a dielectric film composed of, for instance, $MgF_2$ and TiON. The reflection film 12 is an HR film having reflectance of 10% or higher (for example, 20%), and may suppress an optical output leaking to an outside from the reflection film 12. The reflection film 12 may be constituted of a multilayer film, formed by alternately stacking, for instance, three cycles of $SiO_2$ and TiON. Here, reflectance is defined as reflectance toward the inside of the semiconductor laser. The reflection film 12 has reflectance of 10% or higher and can suppress the intrusion of stray light incident on the rear end face from outside. Stray light that has intruded in the semiconductor laser 100 through the rear end face is absorbed by the light absorption layer 13. This absorption suppresses the arrival of stray light to the optical cavity of the semiconductor laser 100, namely the SG-DFB region A and the CSG-DBR region B.

In the lower cladding layer 2 of the SG-DFB region A and the CSG-DBR region B, a plurality of diffraction gratings (corrugations) 9 are so arranged as to be separated in predetermined intervals. The arrangement of the diffraction gratings (corrugations) 9 forms sampled gratings in the SG-DFB region A and the CSG-DBR region B. In the SG-DFB region A, the diffraction gratings 9 are provided in the lower cladding layer 2 and are located under the gain regions 31 and the refractive index variable regions 32.

In the SG-DFB region A and the CSG-DBR region B, a plurality of segments are provided in the lower cladding layer 2. Each segment is composed of a single diffraction grating portion and a single space portion, and the diffraction grating portion includes the diffraction grating 9 and the space portion does not include the diffraction grating 9. The segment is a region in which the single space portion is connected to the single diffraction grating portion, and the space portion is sandwiched by the diffraction grating portions positioned at both ends of the space portion. The diffraction grating 9 includes a material having refractive index different from that of the lower cladding layer 2. When the lower cladding layer 2 is made of InP, the diffraction grating may be made of a material, for instance, $Ga_{0.22}In_{0.78}As_{0.47}P_{0.53}$.

The diffraction gratings 9 may be formed by patterning using a two-beam interference exposure method. For forming a space portion between the diffraction gratings 9, after transferring a pattern for the diffraction gratings 9 to a resist film to form a patterned resist film, a light exposure is applied to parts of the patterned resist film which are to form the space portions. A pitch of the diffraction gratings 9 in the SG-DFB region A may be identical to a pitch of the diffraction grating 9 in the CSG-DBR region B, or may be different therefrom. In the present example, both pitches are set identical, for instance. Moreover, the diffraction gratings 9 may have an identical length or different lengths. Further, each of the diffraction gratings 9 in the SG-DFB region A may have an identical length; each of the diffraction gratings 9 in the CSG-DBR region B may have an identical length; and the length of the diffraction gratings 9 in the SG-DFB region A may be different from the length of the diffraction gratings 9 in the CSG-DBR region B.

Next, operation of the semiconductor laser 100 will be described. At first, a temperature controller sets a temperature for the semiconductor laser 100 at a predetermined value. Next, a predetermined driving current is applied to the gain control electrodes 7 and a predetermined electric signal is also applied to the refractive index adjusting electrodes 8, whereby the equivalent refractive index of the refractive index variable regions 32 are adjusted to a predetermined value. The adjustment can generate a discrete gain spectrum in the SG-DFB region A, and the gain spectrum has gain peaks arranged in predetermined wavelength intervals. On the other hand, a predetermined drive current is supplied to the power electrode 21 to adjust each of the heaters 20 so that the equivalent refractive index of the optical waveguide layer 19 in the CSG-DBR region B has a predetermined value. This adjustment can generate a discrete reflection spectrum in the CSG-DBR region B, and the reflection spectrum has reflection peaks arranged in predetermined wavelength intervals. Vernier effect with a combination of the gain spectrum and the reflection spectrum is used to make a stable lasing at a desired wavelength possible.

Figure 2A:
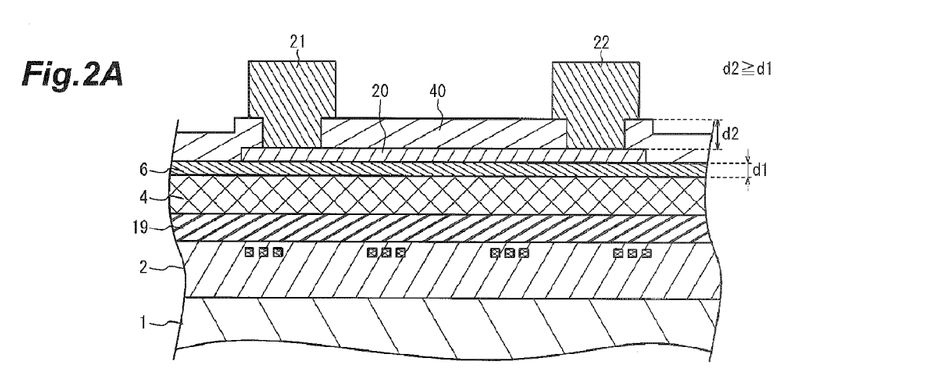
FIG. 2A is an enlarged view illustrating a part of a CSG-DBR region B.
Figure 2B:
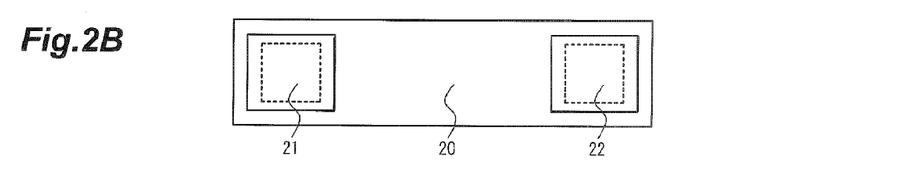
FIG. 2B is a plan view of FIG. 2A.

FIG. 2A is an enlarged view illustrating a part of a CSG-DBR region B in the present example. Referring to FIG. 2A, in one example, the heaters are positioned typically to the respective diffraction gratings provided in the optical waveguide. In another typical example, the heaters may be positioned to the diffraction gratings provided in the gain portions (corresponding to active layers for lasers generally), respectively. FIG. 2B is a plan view of FIG. 2A. As illustrate in FIG. 2A, an insulating film 40 is provided on a surface of each of the heaters 20, and the insulating film 40 protects a surface of a thin film resistor constituting each of the heaters 20.

Each of the heaters 20 is sandwiched by the insulating film 6 and the insulating film 40. The insulating film 6 includes a first region on which the heater 20 is mounted and a second region different from the first region (a region on which the heater 20 is not mounted). In the region on which the heater 20 is not formed (the second region of the insulating film 6), the insulating film 40 is formed on the insulating film 6. The power electrode 21 and the ground electrode 22 extend also on the insulating film 40. The power electrode 21 is connected to the heater 20. As illustrated in FIG. 2A, typically the power electrode 21 and the ground electrode 22 have roughly T-shaped cross sections. The thin film resistor of the heater 20 has a contact portion which is in contact with the power electrode 21 or the ground electrode 22, and there are parts where current to thin film resistor concentrates in the neighborhood of the contact portion. Since the power electrode 21 or the ground electrode 22 extends on a part of the insulating film 40 around the neighborhood region, the power electrode 21 or the ground electrode 22 apply stress to the part of the insulating film 40 on the neighborhood region. As described above, by the concentration of current and the application of stress, the neighborhoods (neighborhoods of the contact portions between the heater 20 and the power electrode 21 and the ground electrode 22) of the contact portions in the thin film resistor has possibility of reducing reliability of the heater 20, compared to the other portion of the thin film resistor.

Accordingly, the laser in the present example is provided with a structure in which stresses are reduced in the neighborhoods of the power electrode 21 and the ground electrode 22. Specifically, a thickness d2 is made to be greater than a thickness d1. Here, the "d1" represents the thickness of the insulating film 6, while the "d2" represents the thickness of the insulating film 40 at the position that is under the power electrode 21 and the ground electrode 22. This structure can relax a stress applied to the heaters 20 from the power electrode 21 or the ground electrode 22 that extends on the insulating film 40, thereby suppressing the reduction in reliability of the heaters 20. For an example, the thickness d1 is about 2000 angstroms, and the thickness d2 is about 4000 angstroms to 6000 angstroms. The thickness d2 may be not less than twice the thickness d1, further preferably, not less than triple the thickness d1.

A material of the insulating films 6, 40 preferably includes silicon nitride because oxygen is not contained as a constituent element in the insulating films 6, 40, which suppress degradation of the heater 20.

Example 2

Figure 3A:
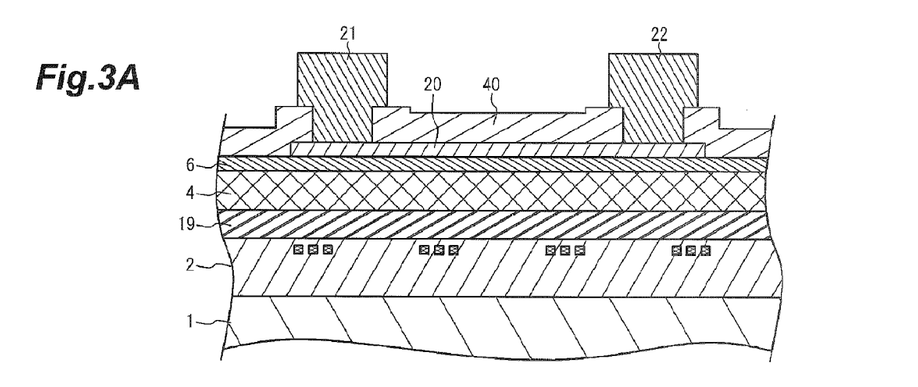
FIG. 3A is an enlarged view showing a part of the device including a heater according to Example 2.
Figure 3B:
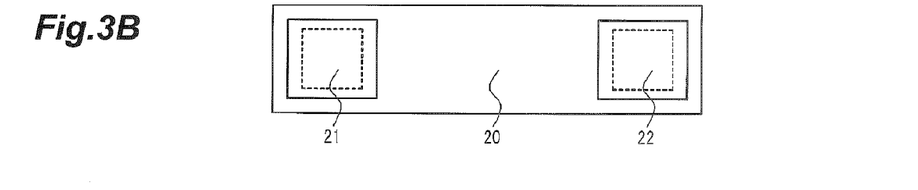
FIG. 3B is a plan view illustrating the part of the device depicted in FIG. 3A.

FIG. 3A is an enlarged view of a part of the device including a heater according to Example 2. FIG. 3B is a plan view illustrating the part of the device depicted in FIG. 3A. Referring to FIG. 3A, the thickness of the insulating film 40 may be made small in a region between the power electrode 21 and the ground electrode 22, namely in a region where the power electrode 21 or the ground electrode 22 is not provided. In the device including a heater according to Example 1, the thickness of the insulating film 40 is made large to relax the stress that the power electrode 21 or the ground electrode 22 apply to the heaters 20. However, the insulating film 40 of the thickness specified for relaxing the stress is also applied to a region which is not covered with the power electrode 21 and the ground electrode 22, which also makes the thickness of the insulating film 40 large in this uncovered region. The insulating film 40 provides a function of protecting a surface of the heater 20, and also provides a dissipation path of the heat generated by the heater 20 depending upon its thermal conductivity thereof. In the present example, the insulating film 40 has a part where the power electrode 21 and the ground electrode 22 do not located, and the small thickness of the part of the insulating film 40 makes it possible to reduce the length of the dissipation of the heat from the heaters 20, thereby enhancing heating efficiency of the heaters 20.

Example 3

Figure 4A:
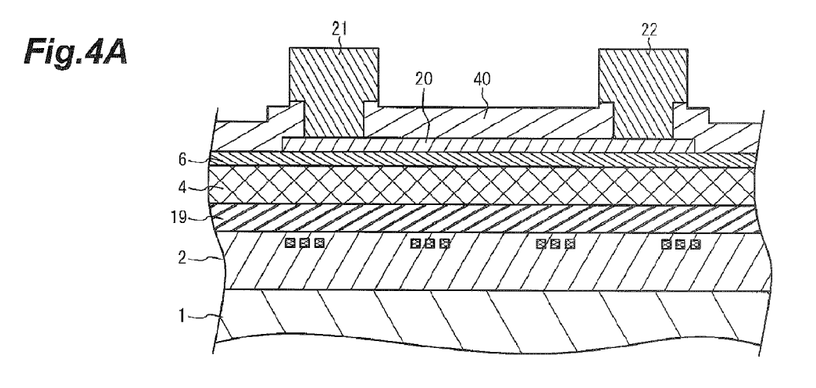
FIG. 4A is an enlarged view showing a part of the device including a heater according to Example 3.
Figure 4B:
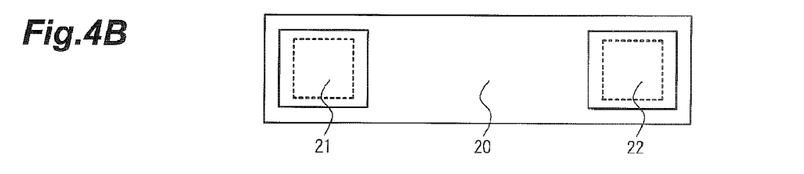
FIG. 4B is a plan view illustrating the part of the device depicted in FIG. 4A.

FIG. 4A is an enlarged view of a part of the device including a heater 20 according to Example 3, and FIG. 4B is a plan view illustrating the part of the device depicted in FIG. 4A. Referring to FIG. 4A, in the region in which the heater 20 is provided, the insulating film 40 may have a large thickness in only the part thereof that is located under the power electrode 21 and the ground electrode 22. In the present example, the reason for making the thickness of the insulating film 40 large is to reduce the stress which the power electrode 21 or the ground electrode 22 apply through the insulating film 40 to the heater 20. In the present example, concerning the insulating film 40 on which with the power electrode 21 or the ground electrode 22 does not extend, the thickness of all the region that is associated with the heater 20 is made smaller than that of the portion of the insulating film on which the power electrode 21 or the ground electrode 22 extends. As a result, it becomes possible to suppress an effect of making the thickness of the insulating film 40 larger, typically reduction in heating efficiency of the heaters 20 as described in Example 2

Example 4

Figures 5A, 5B:
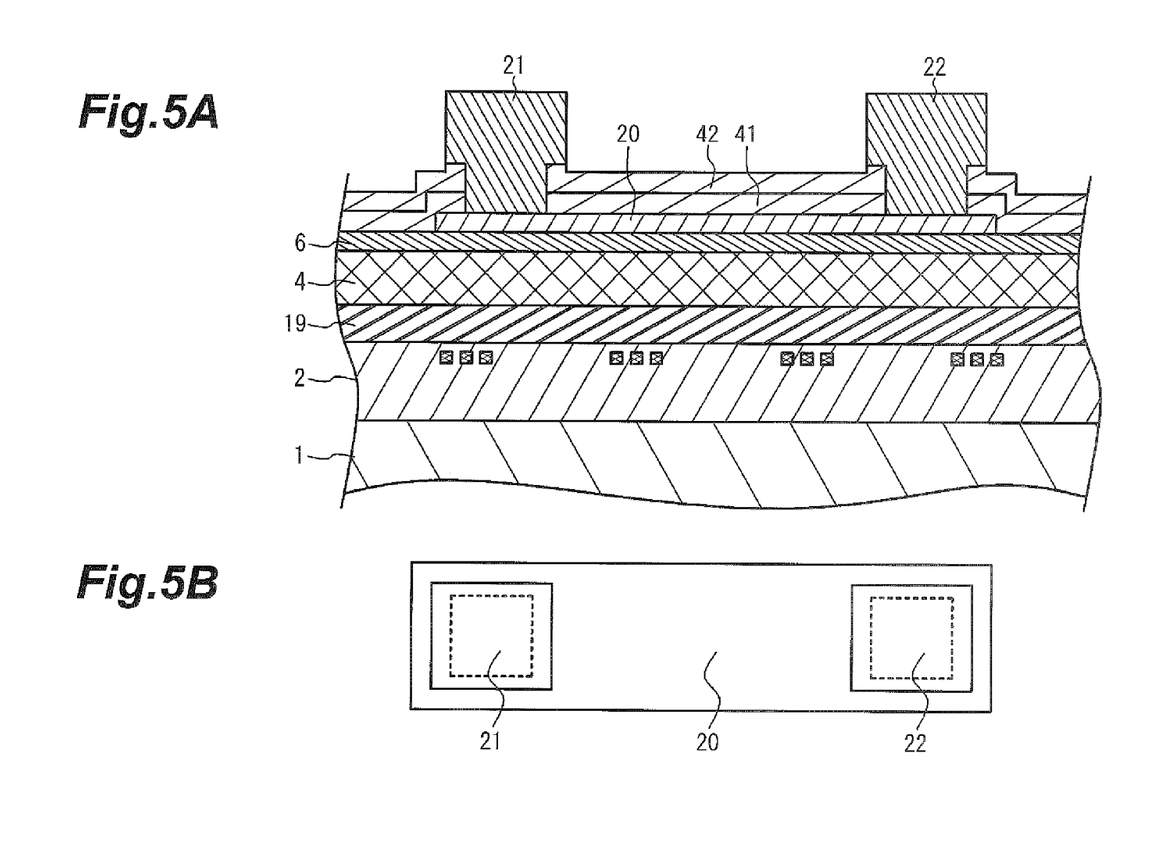
FIG. 5A is an enlarged view showing a part of the device including a heater according to Example 4.
FIG. 5B is a plan view illustrating the part of the device depicted in FIG. 5A.

FIG. 5A is an enlarged view of a part of the device including a heater 20 according to Example 4, and FIG. 5B is a plan view illustrating the part of the device depicted in FIG. 5A. A difference between Example 4 and Example 3 lies in that, as illustrated in FIG. 5A, the insulating film 40 is constituted of two layers of insulating films 41, 42. The insulating films 41, 42 are formed through separate film-forming steps. Therefore, each film forming step in the fabricating method includes heating a substrate once to a film forming temperature; growing the film on the substrate thereat to form a substrate product; and decreasing the substrate temperature from the film forming temperature to room temperature to cool the substrate product. In the above forming steps, an additional thermal history is applied thereto compared to a structure formed by growing all the thicknesses of the insulating film 40 all at once, and this additional thermal history may allow stress against the heaters 20 to become smaller. The present example is effective as a measure by which an additional stress, which may be caused by the large thickness of the coated insulating film (the parts of the insulating film that are covered with the power electrode 21 or the ground electrode 22) of the insulating film 40, is reduced at the insulating film on the heater 20, in particular, at the portions of the insulating film that are covered with the power electrode 21 and the ground electrode 22.

Figure 6A:
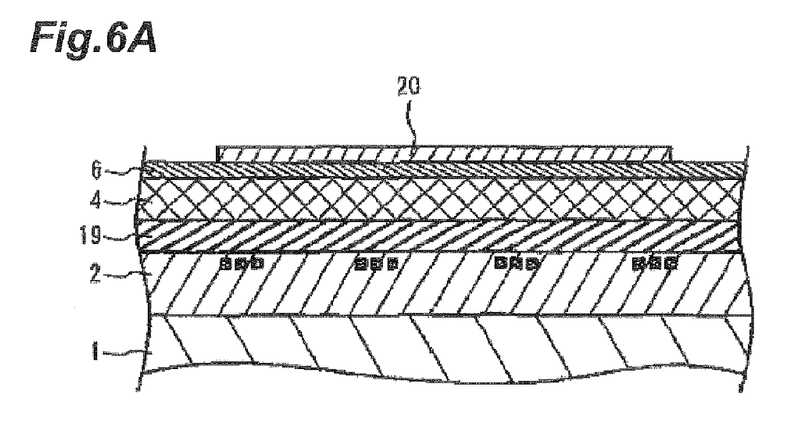
FIG. 6A and FIG. 6B are views illustrating processing steps in the fabrication method.
Figure 6B:
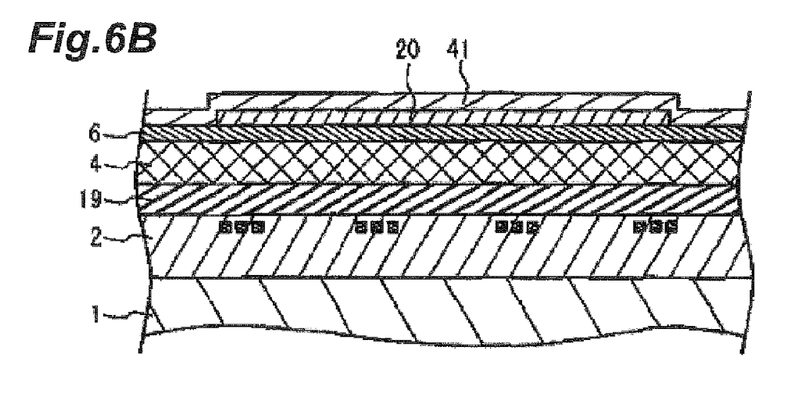

FIG. 6A to FIG. 8B are views illustrating steps in the process of fabricating the device illustrated in FIG. 5A. At first, as illustrated in FIG. 6A, the lower cladding layer 2, the optical waveguide layer 19, the upper cladding layer 4, and the insulating film 6 are formed on the substrate 1. Then, a layer for the heater 20 is grown on the insulating film 6, and the layer is patterned to form the heater 20 of a desired shape. Next, as illustrated in FIG. 6B, the insulating film 41 is grown in a reactor on the heater 20 and an exposed portion of the underlying insulating film 6 which is not covered with the heater 20. After forming the insulating film 41, the substrate temperature is gradually lowered to room temperature. When needed, the semiconductor substrate product is taken out of the deposition chamber of the reactor, and after taking the semiconductor substrate product out of the chamber, the semiconductor substrate product may be rinsed. A thickness of the insulating film 41 is about 2000 angstrom, for instance.

Figure 7A:
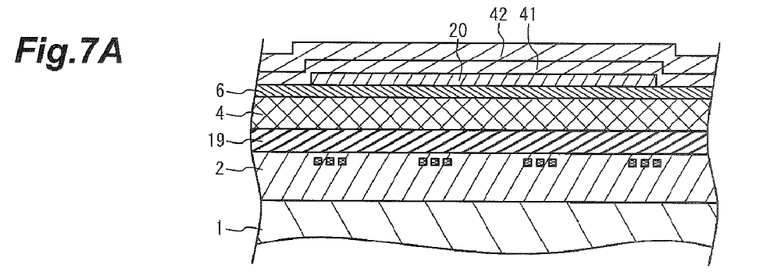
FIG. 7A and FIG. 7B are views illustrating processing steps in the fabrication method.

Next, as illustrated in FIG. 7A, the insulating film 42 is formed on the insulating film 41. It is preferable that a thickness of the insulating film 42 is greater than a thickness of the insulating film 41. For instance, the thickness of the insulating film 42 is about 6000 angstroms. Next, as illustrated in FIG. 7B, the insulating film 41 and the insulating film 42 is etched to form a window in the insulating film 41 and the insulating film 42 at a position where the power electrode 21 and the ground electrode 22 are to be located.

Figure 7B:
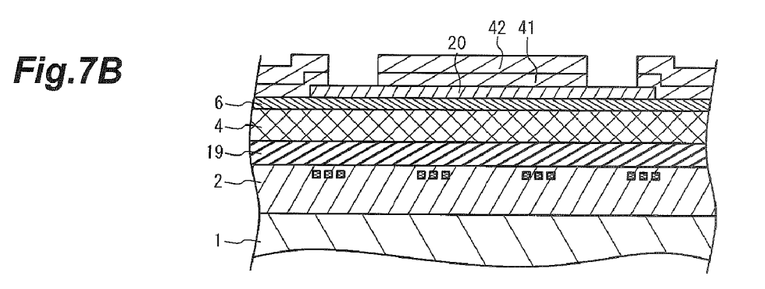
Figure 8A:
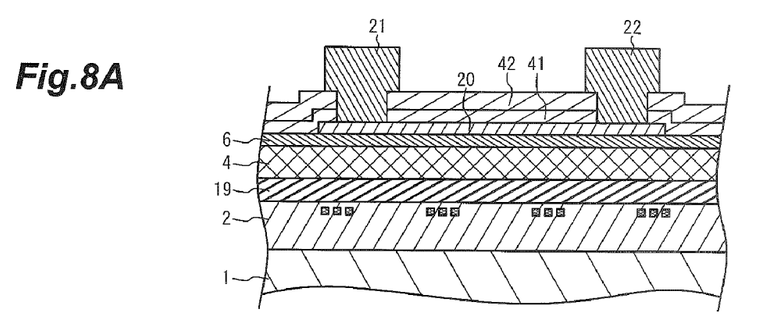
FIG. 8A and FIG. 8B are views illustrating processing steps in the fabrication method.
Figure 8B:
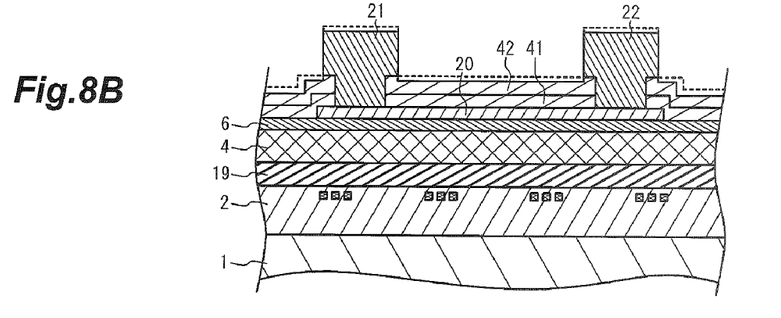

Next, as illustrated in FIG. 8A, in the window formed in the step illustrated in FIG. 7B, the power electrode 21 and the ground electrode 22 are made by plating to form a substrate product. Since the power electrode 21 and the ground electrode 22 are formed by plating, the power electrode 21 and the ground electrode 22 are formed so as to have a size more than an opening size of the window of the insulating films 41, 42, so that each of the power electrode 21 and the ground electrode 22 includes a main body defined by sizes of the window of the insulating films 41, 42, and an extension extending along the surface of the insulating film from an edge of the window of the insulating films 41, 42, so that the power electrode 21 and the ground electrode 22 have substantially T-shaped cross sections. Next, as illustrated in FIG. 8B, by using the power electrode 21 and the ground electrode 22 as an etching mask, the substrate product is dry etched to reduce a thickness of the part of the insulating film 42 that are not covered with the power electrode 21 and the ground electrode 22, namely between the power electrode 21 and the ground electrode 22. By the step described above, the fabrication method according to one example is completed.

As explained above, the optical semiconductor device and the process of fabricating the device according to the present invention may suppress the degradation of the heater.

While, hereinabove, the principle of the present invention has been explained in the preferable embodiments with reference to the drawings, it is recognized by those skilled in the art that the present invention can be changed in disposition and in detail without departing from such a principle. Accordingly, the right is claimed for all the modifications and variations based on the range and the spirit of the claims.

What is claimed is:

1. A method of fabricating an optical semiconductor device, comprising the steps of:
    forming a first insulating film on an optical waveguide;
    forming a heater on the first insulating film;
    forming a second insulating film on the heater, the second insulating film having a thickness greater than that of the first insulating film;
    forming a window in the second insulating film, the heater being exposed through the window; and
    forming an electrode on a principal surface of the heater in the window of the second insulating film, on a side surface of the second insulating film in the window of the second insulating film, and on a principal surface of the second insulating film,
    wherein the step of forming the second insulating film includes the steps of:
        growing a first layer constituting a part of the second insulating film;
        lowering temperature to room temperature from a growth temperature at which the part of the second insulating film is grown, after growing the first layer; and
        growing a second layer constituting a remaining part of the second insulating film, after lowering the temperature, and
    wherein the first insulating film and the second insulating film are made of silicon nitride.

2. The method according to claim 1, further comprising the step of reducing a thickness of a part of the second insulating film in an area of the second insulating film exposed from the electrode.

3. The method according to claim 2, wherein the step of reducing the thickness of the second insulating film includes a step of performing etching of the second insulating film by using the electrode as a mask.

4. A method of fabricating an optical semiconductor device, comprising the steps of:
    forming a first insulating film on an optical waveguide;
    forming a heater on the first insulating film;
    forming a second insulating film on the heater, the second insulating film having a thickness greater than that of the first insulating film, the step of forming the second insulating film including the steps of:
        growing a first layer constituting a part of the second insulating film,
        lowering temperature to room temperature from a growth temperature at which the part of the second insulating film is grown, after growing the first layer, and
        growing a second layer constituting a remaining part of the second insulating film, after lowering the temperature;
    forming a window in the second insulating film, the heater being exposed through the window; and
    forming an electrode on the second insulating film, the electrode being in contact with the heater through the window, and the electrode extending on the second insulating film.

* * * * *